United States Patent [19]

Lee et al.

[11] Patent Number: 5,063,102
[45] Date of Patent: Nov. 5, 1991

[54] RADIATION CURABLE ORGANOSILOXANE GEL COMPOSITIONS

[75] Inventors: Chi-Long Lee; Michael A. Lutz; Bernard VanWert, all of Midland, Mich.

[73] Assignee: Dow Corning Corporation, Midland, Mich.

[21] Appl. No.: 444,351

[22] Filed: Dec. 1, 1989

[51] Int. Cl.$^5$ .................. B32B 9/06; B32B 15/04; C08G 77/00
[52] U.S. Cl. .................. 428/209; 428/450; 428/901; 522/99
[58] Field of Search .................. 522/99; 428/209, 450, 428/901

[56] References Cited

U.S. PATENT DOCUMENTS

| | | | |
|---|---|---|---|
| 3,020,260 | 2/1962 | Nelson | 260/46.5 |
| 3,873,499 | 3/1975 | Michael et al. | 260/46.5 |
| 4,052,529 | 10/1977 | Bokerman et al. | 428/537 |
| 4,303,484 | 12/1981 | Takamizawa et al. | 204/159.13 |
| 4,374,967 | 2/1983 | Brown et al. | 528/15 |
| 4,780,486 | 10/1988 | Lee et al. | 522/14 |

*Primary Examiner*—Marion E. McCamish
*Assistant Examiner*—Susan Berman
*Attorney, Agent, or Firm*—Robert Spector

[57] ABSTRACT

Organosiloxane compositions that cure in the presence of ultraviolet radiation comprise a polymethylsiloxane containing a specified combination of mono-, di- and trifunctional siloxane units, an amount of a mercaptoalkyl-substituted polyorganosiloxane or an organic mercaptan in an amount sufficient to cure the composition to a soft, repairable gel and an amount of a photoinitiator sufficient to initiate curing of the composition in the presence of ultraviolet radiation. The cured compositions are particularly useful as coatings and encapsulants to protect electronic devices against the deleterious effects of materials present in the environment adjacent to said devices.

6 Claims, No Drawings

RADIATION CURABLE ORGANOSILOXANE GEL COMPOSITIONS

BACKGROUND OF THE INVENTION

1. Field of the Invention

This invention relates to radiation curable organosiloxane compositions. More particularly, this invention relates to one part organosiloxane compositions that cure upon exposure to ultraviolet radiation to yield gels that will not harden at low temperatures and provide suitable coatings and encapsulants for electronic components.

2. Description of the Prior Art

Organosiloxane gels are characterized by their softness and resiliency. The hardness of cured gels is typically too low to be measured on any of the Shore durometer scales, including the "00" scale. The hardness of these gels is sometimes expressed as the depth to which a probe of specified dimensions and weight will penetrate a cured gel.

One of the more popular uses of organosiloxane gels is as protective coatings and encapsulants for electrical and electronic components, particularly solid state devices such as integrated circuits, and electrical connectors. The gel prevents penetration of atmospheric moisture and other materials that can corrode or otherwise damage the component.

Two types of gels that are particularly suitable for this application are the dielectric gels described in U.S. Pat. No. 3,020,260, which issued to Nelson on Feb. 6, 1962 and in U.S. Pat. No. 4,374,967. which issued to Brown et al. on Feb. 22, 1983. The gels described in the Brown et al. patent are particularly desirable because they retain their properties, particularly softness, at very low temperatures.

The curable compositions described in the Brown et al. patent cure by a platinum-catalyzed hydrosilylation reaction between a vinyl-substituted polymethylsiloxane of specified composition and an organohydrogensiloxane containing an average of more than one silicon-bonded hydrogen atom per molecule. This curing mechanism is more desireable than others described in the prior art for the curing of organosiloxane compositions based on the relatively rapid cure rate and the absence of by-products that are typically associated with moisture curable organosiloxane compositions.

A disadvantage of compositions such as those described by Brown et al. is their relatively poor storage stability, which requires that the organohydrogensiloxane and the platinum catalyst be packaged in separate containers if the composition is to be stored for any considerable time prior to use. When all of the ingredients of the composition are blended together they require from several minutes to several hours to cure, depending upon the temperature. Another disadvantage of this type of composition is the susceptibility of the platinum-containing catalyst to deactivation by various impurities, including sulfur compounds.

The prior art describes several types of organosiloxane compositions that cure in one minute or less when exposed to ultraviolet radiation in the presence of a suitable photoinitiator.

U.S. Pat. No. 4,052,529. which issued to G. Bokerman et al. on Oct. 4, 1977 discloses compositions suitable for use as coatings for release papers. The compositions comprise (1) a polydiorganosiloxane wherein a portion of the repeating siloxane units contain mercaptoalkyl groups as substituents, (2) a cyclic methylvinylsiloxane and (3) benzophenone as the photoinitiator. The compositions contain from 1 to 5 mercapto groups per vinyl radical.

The ultraviolet light-curable compositions described in U.S. Pat. No. 4,780,486, which issued to C. Lee and M. Lutz on Oct. 25, 1988 comprise an alkenyl-substituted polydiorganosiloxane, a mercaptoalkyl-substituted polydiorganosiloxane or a polyfunctional organic mercaptan as the crosslinking agent and a photoinitiator that decomposes to yield free radicals in the presence of ultraviolet radiation. The free radicals, in turn, initiate curing of the organosiloxane composition. The molar ratio of mercaptoalkyl radicals or mercapto groups to vinyl radicals in the compositions described in this patent is from 0.67 to 2.

A disadvantage of organosiloxane compositions that cure by the radiation-initiated reaction of mercapto groups with alkenyl groups is the adverse effect the cured materials can have on the electrical performance of electrical and electronic devices that are coated with these materials due to the tendency of sulfur to corrode metals. This limits the types of substrates that can be coated with the elastomeric compositions described in the aforementioned Lee and Lutz patent, which specifies that the compositions contain from 0.5 to 1.5 alkenyl radicals per mercapto group.

U.S. Pat. No. 3,873,499, which issued to K. Michael, A. Mink and D. Mitchell on Mar. 25, 1975 describes mercaptoalkyl-substituted organosiloxane resins that cure in the presence of cyclic methylvinyl siloxanes and ultraviolet light. The resins contain mercaptopropylsiloxy, propylsiloxy, and dimethylsiloxane units. The curable compositions contain from 0.8 to 1.2 vinyl radicals per mercapto group.

U.S. Pat. No. 4,303,484, which issued to M. Takamizawa et al. on Dec. 1, 1981 discloses photocurable organosiloxane compositions suitable for use as release coatings. The compositions contain an organopolysiloxane with at least two mercaptoalkyl groups per molecule, an organopolysiloxane having at least two alkenyl groups per molecule and an organopolysiloxane containing at least one benzoin group per molecule. The molar ratio of alkenyl radicals to mercapto groups is preferably from 0.5 to 2.

The present inventors discovered that when curable compositions containing an alkenyl-substituted polyorganosiloxane of the type described in the aforementioned Brown et al. patent, a photoinitiator and a relatively small amount of a mercapto-substituted polyorganosiloxane as the curing agent are exposed to ultraviolet radiation the compositions cure in a minute or less. Moreover, cured gels prepared using the present compositions remain soft and flexible even at low temperatures and are suitable for encapsulation of hybrid circuits and other electronic devices. When applied to metal surfaces preferred compositions cause less corrosion relative to prior art compositions that cure by a similar mechanism.

SUMMARY OF THE INVENTION

Organosiloxane compositions that cure in the presence of ultraviolet radiation comprise a polymethylsiloxane containing a specified combination of mono-, di- and trifunctional siloxane units, an amount of a mercaptoalkyl-substituted polyorganosiloxane in an amount sufficient to cure the composition to a soft, repairable gel and an amount of a photoinitiator sufficient to initiate curing of the composition in the presence of ultraviolet radiation.

DETAILED DESCRIPTION OF THE INVENTION

The present invention provides an organosiloxane gel composition that cures upon exposure to ultraviolet radiation said composition comprising (1) a polyorganosiloxane consisting essentially of 80 to 97 mol percent of $(CH_3)_2SiO$ units, 2 to 10 mol percent of $CH_3SiO_{1.5}$ units. 1 to 6 mol percent of $(CH_3)_3SiO_{0.5}$ units and 0.2 to 4 mol percent of units represented by the formula $(CH_3)_aR^1 SiO_{(3-a)/2}$, where $R^1$ represents 3-cyclohexenyl, cyclohexenylethyl or $CH_2=CH(CH_2)_x$, is 1 or 2, and x represents 0 or an integer from 1 to 6, inclusive:

(2) as the curing agent for said composition, a liquid organic compound containing an average of at least two mercapto groups per molecule or a liquid mercaptoalkyl substituted polydiorganosiloxane containing an average of at least two repeating units per molecule corresponding to the formula

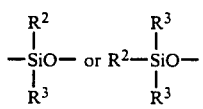

where $R^2$ represents a mercaptoalkyl radical. $R^3$ represents a monovalent hydrocarbon or halohydrocarbon radical, and said curing agent is compatible with the other ingredients of said composition; and 3) a photointiator in an amount sufficient to promote curing of said composition in the presence of ultraviolet radiation,
where the molar ratio of mercapto groups or mercaptoalkyl radicals to alkenyl radicals in said composition is 1 or less.

A. THE ALKENYL-SUBSTITUTED POLYORGANOSILOXANE (INGREDIENT A)

The alkenyl-substituted polyorganosiloxanes, also referred to in this specification as ingredient A. are liquids under ambient conditions and contain from 80 to 97 mol percent of difunctional dimethylsiloxane units, $(CH_3)_2SiO$, from 2 to 10 mol percent of trifunctional monomethylsiloxy units, $CH_3SiO_{3/2}$, from 1 to 6 mol percent of trimethylsiloxy units. $(CH_3)_3SiO_{1/2}$ and from 0.2 to 4 mol percent of organoalkenylsiloxy units of the formula $(CH_3)_aR^1SiO_{(3-a)/2}$, where $R^1$ represents 3-cyclohexenyl, cyclohexenylethyl or $CH_2=CH(CH_2)_x$, a is 1 or 2, and x represents 0 or an integer from 1 to 6, inclusive.

The presence of the trifunctional monomethylsiloxy units is considered responsible for the excellent low temperature properties of gels prepared using the present alkenyl-substituted polymers. In the absence of these units the polymer would be in a hard crystalline phase at temperatures below about $-40°$ C.

One class of polyorganosiloxanes that can be combined with a curing agent containing at least two mercapto groups per molecule and a photoinitiator to form the present curable compositions is described in U.S. Pat. No. 4,374,967, which issued to Paul Brown et al. on Feb. 22, 1983.

A preferred class of alkenyl-substituted polyorganosiloxanes contain from 87 to 95 mol percent of dimethylsiloxane units, from 3 to 6 mol percent of monomethylsiloxy units, from 1.5 to 5 mol percent of trimethylsiloxy units and from 0.5 to 1.5 mol percent of dimethylvinylsiloxy units.

The alkenyl substituted polyorganosiloxanes described as ingredient A can be used in combinations with other compatible liquid organosiloxanes containing an average of at least two silicon-bonded ethylenically unsaturated hydrocarbon radicals per molecule. The concentration of the additional organosiloxane(s) can be up to about 50 weight percent, based on the total concentration of ethylenically unsaturated organosiloxanes present in the curable composition. Diorganosiloxanes wherein the ethylenically unsaturated radical is vinyl and the silicon atoms are bonded to at least one methyl radical are preferred. Any hydrocarbon radicals other than methyl or vinyl are preferably phenyl or 3,3,3-trifluoropropyl.

B. THE CURING AGENT (INGREDIENT B)

The alkenyl-substituted polyorganosiloxane (Ingredient A) of the present compositions, is cured by reacting with a liquid polyorganosiloxane containing an average of at least two silicon-bonded mercaptoalkyl radicals per molecule or with an organic compound containing an average of at least two mercapto (—SH) groups per molecule.

The silicon atoms that constitute the mercaptoalkyl-substituted polydiorganosiloxane can be arranged in a linear or branched configuration. One requirement of this ingredient is that it be compatible with the other ingredients of the present curable compositions.

Preferred embodiments of ingredient B are can be represented by the average formula

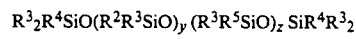

where $R^2$ represents a mercaptoalkyl radical containing from 2 to 6 carbon atoms, each $R^3$ represents methyl, phenyl, or 3,3,3-trifluoropropyl $R^4$ represents $R^2$, $R^3$ or a hydroxyl group, each $R^5$ is methyl or phenyl, y and z are each 0 or greater, with the proviso that $R^4$ represents a mercaptoalkyl radical when both y and z are 0.

Most preferably the radicals represented by $R^3$, $R^4$ and $R^5$ are methyl, and ingredient B is represented by the average formula

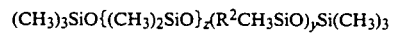

where $R^2$, y and z have the same definitions as in formula I and y is at least 2. $R^2$ is preferably 3-mercaptopropyl or mercaptoisobutyl, based on the availability of the corresponding intermediates that are used to prepare ingredient B, y is from 40 to 45 inclusive and z is from 3 to about 10.

The second class of curing agents are organic compounds containing an average of at least 2 mercapto (—SH) groups per molecule. In addition to these groups the compounds contain carbon, hydrogen and, optionally, oxygen. These organic compounds preferably contain from 2 to 6 mercapto groups per molecule. The organic compound can be, for example, a mercaptan, a mercaptocarboxylic acid or an ester derived from a mercaptocarboxylic acid and a mono- or polyhydric alcohol. Examples of suitable organic compounds include but are not limited to 2,2'-dimercaptodiethylether, dipentaerythritolhexa(3-mercaptopropionate), glycol dimercaptoacetate, trimethylolpropane trithioglycolate and trimethylolpropane trimercaptopropionate.

The molar ratio of mercapto groups in ingredient B to alkenyl radicals in ingredient A is critical to the physical properties of cured gels prepared using the compositions of this invention. This ratio is 1 or less, and is preferably 0.5 or less to avoid any adverse effect on the long-term electrical properties of integrated circuits and other electronic components that are coated or encapsulated using the present compositions.

C. THE PHOTOINITIATOR (INGREDIENT C)

The photoinitiator (ingredient C) can be any compound that will initiate a reaction between the silicon-bonded alkenyl radicals of ingredient A and the mercapto groups or silicon-bonded mercaptoalkyl radicals of ingredient B when the curable compositions of this invention are exposed to ultraviolet light. One requirement of the photoinitiator is that it be compatible with the other ingredients of the present compositions. Compatibility can readily be determined by blending one weight percent of the candidate with the other liquid ingredients of the curable composition and mixing the resultant composition at room temperature or with heating to a temperature of about 80° C. The resultant composition should be optically clear without any dispersed or precipitated material.

A second requirement of the photoinitiator is that it does not cause the ingredients of the curable composition to react with one another in the absence of ultraviolet light.

Photoinitiators that can be used in the present curable compositions include but are not limited to benzophenone. acetonaphthone, acetophenone, benzoin methyl ether, benzoin isobutyl ether, 2-hydroxy-2-methyl-1-phenylpropan-1-one, 1-hydroxycyclohexylphenyl ketone, 2,2-diethoxyacetophenone, 3-hydroxypropylphenyl ketone and 3-hydroxypropyl-p-isopropylphenyl ketone. Preferred photoinitiators include 2-hydroxy-2-methyl-1-phenylpropan-1-one, 1-hydroxycyclohexylphenyl ketone, 2,2diethoxyacetophenone and 3-hydroxypropyl phenyl ketone.

Other classes of useful photoinitiators include compatible polysilanes of the type described by West in U.S. Pat. No. 4,260,780, which issued on Apr. 7. 1981: the aminated methylpolysilanes described by Baney et al. in U.S. Pat. No. 4,314,956, which issued on Feb. 9, 1982; the methylpolysilanes described by Peterson et al. U.S. Pat. No. 4,276,424, which issued on June 30, 1981; and the polysilastyrene described by West et al, in U.S. Pat. No. 4,324,901, which issued on Apr. 13, 1982. All of these U.S. Patents are incorporated by references as teachings of suitable photoinitiators.

D. OPTIONAL INGREDIENTS

In addition to the alkenyl-substituted polyorganosiloxane, curing agent and photoinitiator the present compositions can contain up to about one weight percent of conventional viscosity stabilizers to inhibit gelation during storage. Acceptable stabilizers limit the increase in viscosity during a 24 hour period at 100° C. to a factor of less than two, i.e. a doubling of viscosity.

Examples of suitable viscosity stabilizers include amines such as 2-(diisopropylamino)ethanol and trioctylamine and free radical scavengers such as p-methoxyphenol, catechol, hydroquinone and 2,6-di-t-butyl-p-methylphenol.

To ensure complete curing of the present compositions it may be desirable to include as one of the ingredients an organic peroxide that decomposes at a temperature within the range of from about 100° to about 250° C. This is particularly true if the substrate to which the composition will be applied is contoured such that a portion of the curable composition is shielded from the ultraviolet radiation to which the coated substrate is subsequently exposed for the purpose of curing the gel composition.

The curable gel compositions can contain a reinforcing filler or other type of reinforcing agent to improve the physical properties of the cured material. In those applications where transparency of the cured gel is a requirement the reinforcing agent is preferably a finely divided hydrophobic silica of the type described in U.S. Pat. No. 4,344,800, which issued to Michael A. Lutz on Aug. 17, 1982. The disclosure of this patent is incorporated into this specification by reference thereto as a teaching of silica fillers suitable for use in the optically clear gel compositions of this invention.

E. PREPARATION AND CURING THE CURABLE COMPOSITIONS

The ingredients of the present compositions are blended to form a homogeneous mixture using any of the known techniques that will not adversely affect the storage stability of the composition in the absence of ultraviolet light. Unless the composition exhibits borderline storage stability in the absence of ultraviolet radiation, the order in which the ingredients are added is not critical. If the ingredients have a tendency to react, it is preferable that the ingredient A be added first followed by the viscosity stabilizer and, lastly, the mercapto-containing curing agent and photoinitiator.

Curable compositions containing a viscosity stabilizer can typically be stored for longer than about 6 months under ambient conditions.

The present compositions cure rapidly, typically requiring about one second or less of exposure to the radiation from a medium pressure mercury vapor arc lamp. The amount of energy required to cure preferred compositions is from 0.1 to about 3 joules per square centimeter, depending upon the ingredients and the thickness of the layer of curable composition applied to a substrate.

The intensity of the radiation used to cure the present compositions can be measured using any of the available techniques. A preferred method employs an integrating photometer which is exposed to a mercury vapor arc lamp or other source of UV radiation under the same conditions used to cure the coated substrate. A commercially available integrating photometer is the "Light Bug" available from International Light.

The following examples are intended to describe preferred embodiments of the present invention and should not be interpreted as limiting the scope of the invention as defined in the accompanying claims. Unless otherwise specified all parts and percentages specified in the examples are by weight and viscosities were measured at 25 degrees C.

EXAMPLE 1

A curable composition of this invention was prepared by blending the following ingredients to homogeneity:

97.5 parts of an organosiloxane copolymer containing the following units, expressed in mol percent, 94 percent dimethylsiloxane units, 1 percent dimethylvinylsiloxy units, 2 percent trimethylsiloxy units, and 3 percent monomethylsiloxy units. The viscosity of the copolymer was $10^{-5}$ m$^2$/s at 25° C.;

1.25 parts of a trimethylsiloxy-terminated diorganosiloxane copolymer containing an average of 43 dimethylsiloxane units and 4 methyl-3-mercaptopropylsiloxane units per molecule; and 1.25 parts of 2-hydroxy-2-methyl-1-phenylpropan-1-one as the photoinitiator.

The test sample used to evaluate the composition was an electronic device comprising an integrated circuit having an aluminum lead frame and mounted on a small circuit board enclosed on all sides by walls formed from an organic polymer. The circuit board was covered with a layer of curable composition having a thickness of about 0.6 cm. The test sample was then passed under a mercury vapor arc at a speed of two feet per minute to cure the composition. The amount of radiation received by the sample was 3 joules/cm$^2$. The composition cured to a gel during this exposure.

The test sample containing the cured gel was then placed in a chamber and subjected to 1000 temperature cycles of from −55° to 125° C. to simulate the conditions in the engine compartment of an automobile. There was no evidence of any electrical failure of the electronic circuit following this test.

The test sample was then placed in a chamber and exposed to 85° C. and a relative humidity of 85% for 100 hours. No electrical failures were observed following this portion of the test procedure.

Finally the test sample was exposed to a salt water spray for 500 hours, at which time the exposed portion of the aluminum lead frame of the integrated circuit was visually inspected for evidence of corrosion. No evidence of corrosion was observed.

EXAMPLE 2

This example describes curable compositions containing mercapto-substituted curing agents that are within the scope of the present invention.

The vinyl-containing polymer (A1) was of the same type described in the preceding example 1, and contained 0.4 weight percent of vinyl radicals. One of the compositions evaluated contained 7.5 parts by weight of A1 and 2.5 parts by weight of a second polyorganosiloxane (A2). A2 was a liquid dimethylvinylsiloxy-terminated polyorganosiloxane containing 93 mole percent of dimethylsiloxane units, 7 mole percent methyl-3,3,3-trifluoropropylsiloxane units and 0.6 weight percent of vinyl radicals.

One of the two curing agents (B1) was a dimethylmercaptoisobutylsiloxy-terminated polydimethylsiloxane containing an average of 5 dimethylsiloxane units per molecule. The second curing agent (B2) was a trimethylsiloxy-terminated random copolymer containing an average of 90 dimethylsiloxane units and 8 methylmercaptoisobutylsiloxane units per molecule. Curing agent B1 was used in combination with polymer A1 at a concentration of 5, 4.3 and 2.8 weight percent, based on vinyl-containing polymer, which was equivalent to a molar ratio of mercapto to vinyl groups of 1.0, 0.75 and 0.5 respectively.

The curable compositions contained 2,2-diethoxyacetophenone (Ingredient C) as the photoinitiator in an amount specified in the following table.

Each of the curable compositions were coated as a 0.008 inch (0.2 mm)-thick film onto a sheet of aluminum and then placed on a conveyer that passed under two medium pressure mercury vapor arc lamps housed in an Ashdee Model UV-24H Lab Reactor. The speed of the conveyor was 90 feet (27.4 meters) per minute, equivalent to an exposure time of one second. The quantity of radiation reaching the coated sheet was 38 mJ/cm$^2$, measured using a model 205 UV Powermeter supplied by Optical Associates and equipped with a 365 nanometer probe. The distance between the lamps and the coated sheet was about 10 cm. All of the compositions cured to a soft, flexible, transparent gel under these conditions.

The types and amounts of ingredients present in the curable compositions evaluated are summarized in the following table.

| Ingredient (Parts) | Sample No. 1 | 2 | 3 | 4 | 5 |
|---|---|---|---|---|---|
| A1 | 10.0 | 10.0 | 10.0 | 10.0 | 7.5 |
| A2 | 0.0 | 0.0 | 0.0 | 0.0 | 2.5 |
| B1 | 0.50 | 0.43 | 0.28 | 0.0 | 0.73 |
| B2 | 0.0 | 0.0 | 0.0 | 0.81 | 0.0 |
| C | 0.106 | 0.104 | 0.103 | 0.108 | 0.107 |

Analysis by differential scanning calorimetry indicated a glass transition temperature of −123° C. for all of the cured gels, making them ideally suited for use in low temperature environments.

The penetration values for the gels prepared using samples 1 and 2 were 45 and 100 micrometers/gram, respectively. These values were measured using a DuPont Instruments Model 943 Thermomechanical Analyzer equipped with a ¼ inch (0.6 cm.)-diameter probe.

That which is claimed is:

1. An organosiloxane gel composition that cures upon exposure to ultraviolet radiation, said composition comprising
    (1) a polyorganosiloxane consisting essentially of 80 to 97 mole percent of (CH$_3$)$_2$SiO units, 2 to 10 mol percent of CH$_3$SiO$_{1.5}$ units, 1 to 6 mol percent of (CH$_3$)$_3$SiO$_{0.5}$ units and 0.2 to 4 mol percent of units represented by the formula (CH$_3$)$_a$R$^1$SiO$_{(3-a)/2}$, where R$^1$ represents 3-cyclohexenyl, cyclohexenylethyl or CH$_2$=CH(CH$_2$)$_x$, a is 1 or 2, and X represents 0 or an integer from 1 to 6, inclusive;
    (2) as the curing agent for said composition, a liquid organic compound containing an average of at least two mercapto groups per molecule or a liquid mercaptoalkyl substituted polydiorganosiloxane containing an average of at least two repeating units per molecule corresponding to the formula

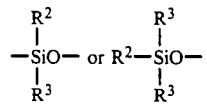

where R$^2$ represents a mercaptoalkyl radical, R$^3$ represents a monovalent hydrocarbon or halohydrocarbon radical, and said curing agent is compatible with the other ingredients of said composition: and
    3) a photointiator in an amount sufficient to promote curing of said composition in the presence of ultraviolet radiation.
where the molar ratio of mercapto groups to alkenyl radicals in said composition is 1 or less.

2. A composition according to claim 1 where $R^1$ is vinyl, said curing agent is represented by the general formula $$R^3{}_2R^4SiO(R^2R^3SiO)_y(R^3R^5SiO)_z SiR^4R^3{}_2$$   I where $R^2$ represents a mercaptoalkyl radical containing from 2 to 6 carbon atoms, each $R^3$ represents methyl, phenyl, or 3,3,3-trifluoropropyl, $R^4$ represents $R^2$, $R^3$ or a hydroxyl group, $R^5$ is methyl or phenyl, y and z are each 0 or greater, with the proviso that $R^4$ represents a mercaptoalkyl radical when both y and z are 0; and said photoinitiator is selected from the group consisting of benzophenone, acetonaphthone, acetophenone, benzoin methyl ether, benzoin isobutyl ether 2-hydroxy-2-methyl-1-phenylpropan-1-one, 1-hydroxycyclohexylphenyl ketone 2,2diethoxyacetophenone, 3-hydroxypropylphenyl ketone and 3-hydroxypropyl-p-isopropylphenyl ketone.

3. A composition according to claim 2 where $R^2$ represents mercaptopropyl or mercaptoisobutyl $R^3$, $R^4$ and $R^5$ represents methyl, y is from 40 to 45 inclusive and z is from 3 to 10, and said polyorganosiloxane contains from 87 to 95 mol percent of dimethylsiloxane units, from 3 to 6 mol percent of monomethylsiloxy units, from 1.5 to 5 mol percent of trimethylsiloxy units and from 0.5 to 1.5 mol percent of dimethylvinylsiloxy units.

4. A composition according to claim 1 where said composition contains a viscosity stabilizer to inhibit curing of said composition during storage.

5. A composition according to claim 1 where said composition contains an organic peroxide.

6. A method for protecting an electronic device against the deleterious effects of materials present in the environment of the device, said method comprising coating or encapsulating said device with a composition according to claim 1 and subsequently exposing said device to ultraviolet radiation for a time period sufficient to cure said composition.

* * * * *